United States Patent [19]
Stevens

[11] Patent Number: 5,750,935
[45] Date of Patent: May 12, 1998

[54] MOUNTING DEVICE FOR ATTACHING A COMPONENT THROUGH AN APERTURE IN A CIRCUIT BOARD

[75] Inventor: David L. Stevens, Mesquite, Tex.

[73] Assignee: Lucent Technologies Inc., Murray Hill, N.J.

[21] Appl. No.: 648,549

[22] Filed: May 16, 1996

[51] Int. Cl.$^6$ ................................................ H01B 17/00
[52] U.S. Cl. ........................ 174/138 G; D8/356; 248/27.3
[58] Field of Search ........................................ 361/807, 760, 361/808, 810; 174/400 C, 138 G, 135; 248/222.12, 217.2, 300, 27.1, 27.3; 24/336, 295; D8/356, 371, 395; 439/59, 76.1, 77, 941, 78, 377

[56] References Cited

U.S. PATENT DOCUMENTS

| | | | |
|---|---|---|---|
| D. 276,272 | 11/1984 | Weissenburger | D24/176 |
| 2,246,722 | 6/1941 | Del Camp | 439/552 |
| 2,605,806 | 8/1952 | Tinnerman | 411/112 |
| 3,335,327 | 8/1967 | Damon et al. | 361/767 |
| 3,501,117 | 3/1970 | Soltysik | 248/71 |
| 4,440,535 | 4/1984 | Oehlke | 411/112 |
| 4,613,925 | 9/1986 | Mohri et al. | 361/810 |
| 4,629,267 | 12/1986 | Stephan | 439/59 |
| 4,667,270 | 5/1987 | Yagi | 361/820 |
| 5,055,971 | 10/1991 | Fudala et al. | 361/760 |
| 5,323,845 | 6/1994 | Kin-Shon | 165/80.3 |
| 5,331,507 | 7/1994 | Kyung et al. | 361/720 |
| 5,351,876 | 10/1994 | Belcher et al. | 228/180.22 |
| 5,386,338 | 1/1995 | Jordan et al. | 361/704 |
| 5,464,054 | 11/1995 | Hinshaw et al. | 165/80.3 |
| 5,636,408 | 6/1997 | Dichtel | 16/6 |

*Primary Examiner*—Kristine L. Kincaid
*Assistant Examiner*—Kamand Cuneo

[57] ABSTRACT

The present invention provides for use with a circuit board having an aperture formed therein for receiving an electrical component therethrough, an electrical component assembling device. The electrical component device, in a preferred embodiment, includes a body member configured to receive the electrical component and at least partially extend through the aperture. A first clip is coupled to the body member and includes a first pressure bearing member for exerting a force against the circuit board to thereby secure the body member to the circuit board. The device further includes a second clip coupled to the body member. The second clip also includes a second pressure bearing member for exerting a force against the electrical component to thereby secure the electrical component to the body member. Thus, the first and second clips act in concert to hold the electrical component and the body member secure with respect to the circuit board.

20 Claims, 2 Drawing Sheets

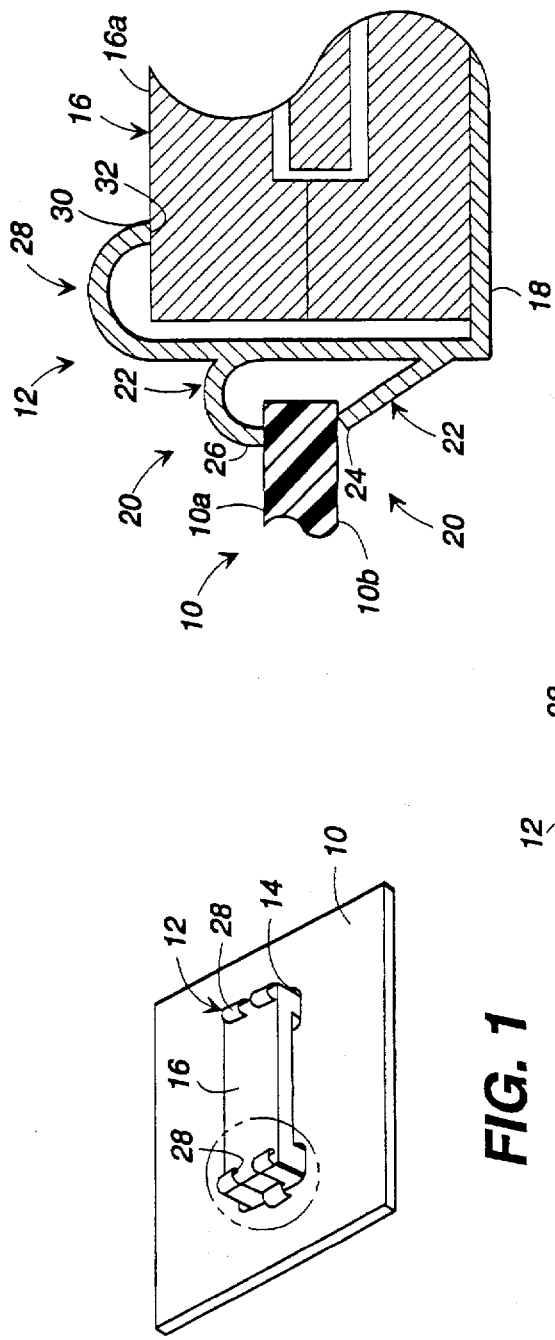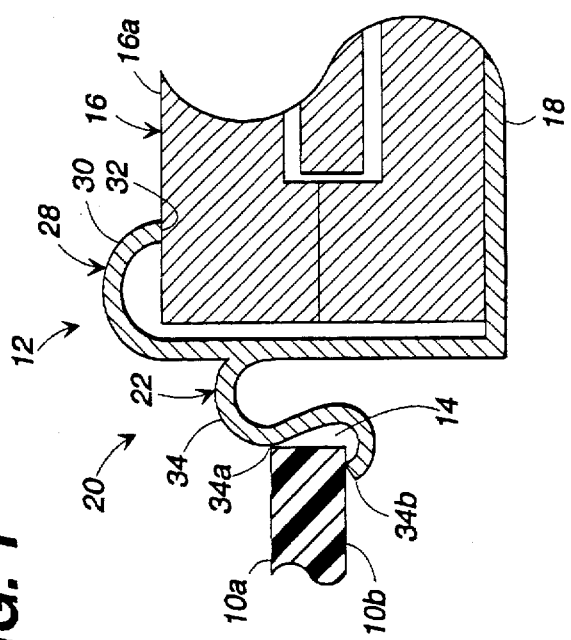

MOUNTING DEVICE FOR ATTACHING A COMPONENT THROUGH AN APERTURE IN A CIRCUIT BOARD

TECHNICAL FIELD OF THE INVENTION

The present invention is directed, in general, to a magnetic component assembly and more specifically, to a clip device for securing magnetic core members together to form a magnetic core assembly and for securing the magnetic core assembly to a circuit board.

BACKGROUND OF THE INVENTION

Surface mounting of electrical components on circuit boards using pick and place equipment is very cost effective in the manufacture of circuits and, therefore, is highly desirable. However, applying this technique to planar magnetic components for integrated and non-integrated applications has been difficult since the magnetic component is an assembly of planar windings, core members and either a spring clip devices or glue. Use of a spring clip requires a lateral force to adequately separate the spring clip to insert the core members in the spring clip. In such instances, the assembly process requires several pieces to be handled simultaneously for proper assembly. As such, the assembly process is not conducive to applications with pick and place equipment. Moreover, because the spring clips must typically be manually spread apart to be placed on the electrical component, automation of this step is particularly difficult.

Assembly devices such as those discussed in U.S. Pat. No. 5,05,971 have been developed to facilitate the assembly process with pick and place equipment. These devices provide a securing clip with a large planar surface that holds two core members of a surface mount magnetic component together. The large planar surface provides an excellent surface for application with pick and place equipment, thereby allowing automation of the magnetic core assembly process. While these devices have excellent application in surface mount applications, they are not well suited for planar applications because there is no mechanism for easily securing the magnetic component clip in the circuit board.

In other assembly processes different types of glue are used to hold the magnetic core halves together. In these processes, a separate assembly process is used to carefully apply the glue and assemble the magnetic core. This separate process requires additional equipment, materials, and manufacturing time, all of which increase the manufacturing cost of the magnetic component. For the non-integrated planar structure the glued magnetic subassembly, is then attached to the main circuit board. For the integrated planar structure, the core halves are glued directly to the main board. While the the gluing process can be used with planar magnetic applications, it involves a costly separate assembling process to assemble the magnetic core components.

Therefore, there is a need in the art for an assembling device that can be used in an automated assembling process and that allows an electrical component to be easily secured to it and that also provides a mechanism for securing the assembling device to a circuit board for planar applications. The assembling device of the present invention provides a device that addresses these needs.

SUMMARY OF THE INVENTION

The present invention provides for use with a circuit board having an aperture for receiving an electrical component therethrough, an electrical component assembling device. The electrical component device, in a preferred embodiment, comprises a body member configured to receive the electrical component and at least partially extend through the aperture. A first clip is coupled to the body member and includes a first pressure bearing member for exerting a force against the circuit board to secure the body member to the circuit board. The device further comprises a second clip coupled to the body member that includes a second pressure bearing member for exerting a force against the electrical component to secure the electrical component to the body member. Thus, the first and second clips act in concert to hold the electrical component and the body member secure with respect to the circuit board.

In another aspect of the present invention, the first pressure bearing member of the first clip includes a flexible securing member that extends outwardly from the body member. The securing member is configured to be partially received through the aperture and has a first engaging portion and a second engaging portion to engage opposite sides of the circuit board to secure the body member to the circuit board. Alternatively, the first pressure bearing member of the first clip includes a flexible first securing member that extends outwardly from the body member and an opposing second securing member that extends outwardly from the body member. The first securing member is configured to be resiliently received through the aperture and the first and second securing members are configured to engage opposite sides of the circuit board, to secure the body member to the circuit board.

In a preferred embodiment, the second pressure bearing member of the second clip is a flexible elongated member that has an inwardly projecting engaging end extending toward the body member to engage an outer surface of the electrical component and exert a force between the outer surface and the body member. Preferably, the second clip comprises at least two of the flexible elongated members that are positioned on opposite sides of the body member in an opposing relationship. The engaging ends of the elongated members may have various configurations. For example, the end may be arcuate, square shaped or "v" shaped. In preferred embodiments, however, the engaging end extends toward the body member to create a securing force against the electrical component when it is inserted in the body member.

Preferably, the first and second clips are integrally formed with the body member, and preferably, are comprised of a flexible material selected from the group consisting of metal and plastic.

In another aspect of the present invention the body member further comprises retaining tabs positioned on opposite side edges of the body member. The retaining tabs are configured to engage a side surface of the electrical component to prevent lateral movement of the electrical component with respect to the body member.

In yet another aspect of the present invention, there is provided an electrical component assembly. In a preferred embodiment, the assembly comprises a circuit board having an aperture for receiving an electrical component therethrough and an electrical component assembling device. The assembling device includes a body member configured to receive the electrical component and at least partially extend through the aperture and a first clip coupled to the body member. The first clip includes a first pressure bearing member for exerting a force against the circuit board to secure the body member to the circuit board. In addition, the assembling device includes a second clip coupled to the body member. The second clip preferably includes a second pressure bearing member for exerting a force against the electrical component to secure the electrical component to the body member.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a perspective view of a circuit board having the assembling device of the present invention secured in the circuit board's aperture and an electrical component secured in the assembling device;

FIG. 2 illustrates a partial cross-sectional view of the assembling device secured to a circuit board with an electrical component secured in the body member of the assembling device;

FIG. 3 illustrates a partial cross-sectional view of an alternate embodiment of the assembling device secured to a circuit board with an electrical component secured in the body member of the assembling device;

DETAILED DESCRIPTION

Figure 4:
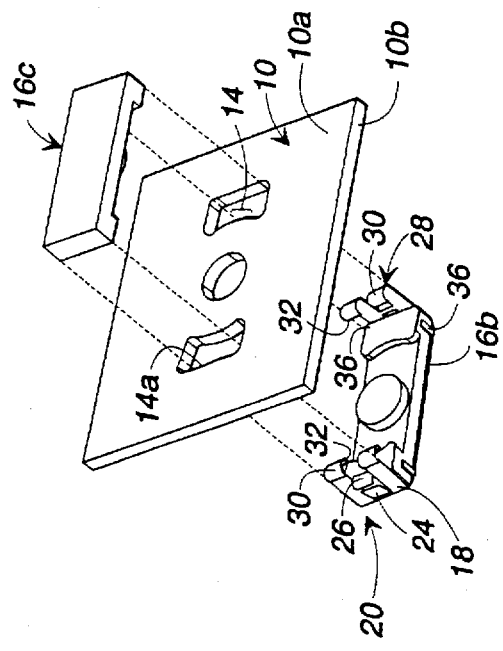
FIG. 4 illustrates an exploded perspective view of the circuit board, the assembling device and the electrical component comprised of first and second core members.

Referring initially to FIG. 1, there is illustrated a perspective view of a conventional circuit board 10 with a preferred embodiment of the assembling device 12 of the present invention secured in the circuit board's aperture 14 and an electrical component 16 secured in the assembling device 12. In preferred applications, the electrical component 16 is a conventional magnetic component comprised of two core halves that cooperatively engage each other through the aperture 14. However, it will, of course, be appreciated that other electrical components may be used as well, depending on the application. As shown, only one of the core halves can be seen, and the assembling device 12 partially extends through the aperture 14, thereby allowing integration of the electrical component 16 into the circuit board 10. The size of the assembling device 12 is configured to be received through the aperture 14 and yet have dimensions that substantially correspond to the dimensions of the electrical component 12 to securely receive the electrical component 16 within the assembling device 12.

Turning now to FIG. 2, there is illustrated a partial cross-sectional view of the assembling device 12 of FIG. 1. The assembling device 12 is comprised of a body member 18 that is configured to receive the electrical component 16 and at least partially extend through the aperture 14. A first clip 20 is coupled to the body member 18 and includes a first pressure bearing member 22 for exerting a securing force against the circuit board to secure the body member 18 to the circuit board 10. In one embodiment, the first pressure bearing member 22 includes a flexible first securing member 24 that extends outwardly from the body member 18 and an opposing second securing member 26 that also extends outwardly from the body member 18. The first securing member 24 is configured to be resiliently received through the aperture 14 and produce a biasing force against the circuit board 10. The first securing member 24 preferably has a generally straight configuration and projects outward at an angle from the body member 18. The second securing member 26 may also be flexible and is capable of producing a biasing force and has an arcuate configuration as shown. However, the securing member's 26 configuration may also have other shapes as well, such as "V" shape or square shape. Whatever the configuration, however, the first and second securing members 24,26 in this embodiment are configured to engage opposite sides 10a,10b of the circuit board 10, to thereby secure the body member 18 to the circuit board 10.

When the body member 18 and electrical component 16 are vertically inserted into the aperture 14, the second securing member 26 is flexed inward by the outer edge 14a of the aperture 14 and then returns to its unflexed position when it passes through the aperture 14. The first and second securing members 24,26 are both preferably flexible to accommodate the thickness of the circuit board 10. The distance normally separating the first and second securing members 24,26 is preferably less than the thickness of the circuit board 10 so that when the assembling device 12 is inserted in the circuit board 10, the first and second securing member 24,26, in a spring-like manner, bias toward and forcefully engage the opposite sides 10a,10b of the circuit board 10 as shown.

Continuing to refer to FIG. 2, the assembling device 12 further comprises a second clip 28 coupled to the body member 18. The second clip 28 includes a second pressure bearing member 30 for exerting a force against the electrical component 16 to thereby secure it to the body member 18. In a preferred embodiment, the second pressure bearing member 30 is a flexible elongated member that has an inward projecting engaging end 32 extending toward the body member 18 to engage an outer surface 16a of the electrical component 16, to thereby exert a force between the outer surface 16a and the body member 16. Preferably, the second clip 28 comprises at least two such flexible elongated members that are positioned on opposite sides of the body member 18 in an opposing relationship (see FIG. 1). The engaging ends 32 of the elongated members may have various configurations. For example, the end may be arcuate, square shaped or "V" shaped. In preferred embodiments, however, the engaging end 32 extends toward the body member 18 to create a securing force when the electrical component 16 is inserted in the body member 18. Thus, the first and second clips 20,28 act in concert to hold the electrical component 16 and the body member 18 secure with respect to the circuit board 10.

FIG. 3 illustrates a partial cross-sectional view of an alternate preferred embodiment of the assembling device 12 secured to the circuit board 10 with an electrical component 16 secured in the body member 18. In this embodiment, the clip 20 includes a flexible securing member 34 that extends outwardly from the body member 18. The securing member 34 is configured to be partially received through the aperture 14 and has a first engaging portion 34a and a second engaging portion 34b to engage opposite sides 10a,10b of the circuit board 10, to thereby secure the body member 18 to the circuit board 10. As illustrated, the flexible securing member 34 preferably has a generally arcuate shape. This shape is configured to allow the first and second engaging portions 34a,34b to engage opposite sides 10a,10b of the circuit board 10 in a way to secure the body member 18 to the circuit board 10. While the preferred configuration is illustrated, it should be appreciated that various configurations may be used to adequately secure the body member 18 in the circuit board 10.

FIG. 4 illustrates an exploded perspective view of the circuit board 10, the assembling device 12 and the electrical component 16. In preferred applications, the electrical component 16 is an "E" shaped magnetic core comprised of first and second core members 16b,16c. The aperture 14 is preferably formed to accommodate the E shape of the first and second core members 16b,16c, thereby sandwiching the circuit board 10 between the core members when the electrical component 16 is secured in the body member 18. The body member 18 may further comprise retaining tabs 36 positioned on the body member's 18 opposite side edges to prevent lateral movement of the electrical component 16.

Figure 6:
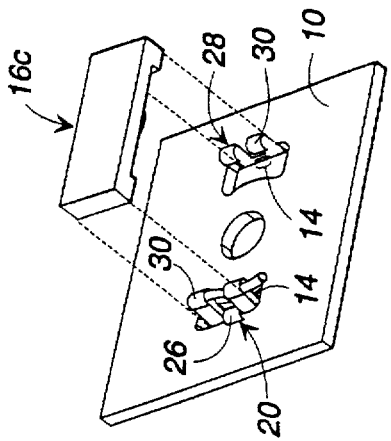
FIG. 6 illustrates an exploded perspective view of the circuit board with the body member of the assembling device and first core member secured to the circuit board.
Figure 5:
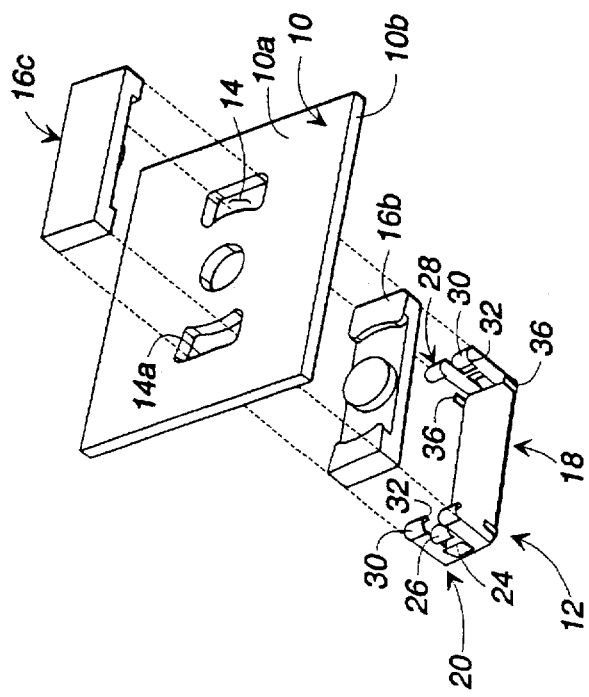
FIG. 5 illustrates an exploded perspective view of the circuit board, the assembling device and the electrical component comprised of first and second core members with one of the core members received in the body member of the assembling device.

Turning now to FIG. 5, there is illustrated an exploded perspective view of the circuit board 10, the assembling device 12 and the electrical component 16 with the first core members 16b received in the body member 18 of the assembling device 12. In a preferred method of assembly, the first core member 16b is inserted in the body member 18 between the retaining tabs 36. As shown in FIG. 6, the body member 18 is partially inserted through the aperture 14. As the body member 18 is vertically inserted, the second securing member 26 (FIG. 2) is flexed inwardly by the outer edge 14a of the aperture 14. When the second securing member 26 passes through and clears the aperture 14, it returns to its unflexed position. The thickness of the circuit board 10 forces the first and second securing members 24,26 apart. The first and second securing members 24,26 respectively flex against the opposite sides 10a,10b of the circuit board 10 in a biasing fashion.

As shown in FIG. 6, the second core member 16c is then vertically inserted in the body member, and as it is inserted, its outer perimeter slightly forces the second pressure bearing members 30 outward until the second core member 16c clears the inwardly projecting engaging end 32, at which time the second pressure bearing member 30 flexes inwardly against the outer surface 16a of the electrical component 16, thereby exerting a securing force between the outer surface 16a and the body member 18. It should be understood that the dimensions of the body member 18, the first and second pressure bearing members 22,30 may vary to accommodate electrical components of varying dimensions.

In an alternate method of application, the electrical component 16 may be a single piece. In such instances, it is inserted in the body member 18 first with the second pressure bearing member 30 functioning in the same way as just described above. The body member 18 and the electrical component 16 are then partially inserted through the aperture 14, with the first and second securing members 24,26 functioning in the same way described above.

As it can be seen from the discussion of the foregoing preferred embodiments, the electrical component can be easily attached to the assembling device, and the assembling device can be easily attached to the circuit board, which secures both the electrical component and the assembling device to the circuit board. This dual attachment property makes the present invention particularly conducive for automated assembling processes.

Although the present invention and its advantages have been described in detail, those skilled in the art should understand that they can make various changes, substitutions and alterations herein without departing from the spirit and scope of the invention in its broadest form.

What is claimed is:

1. For use with a circuit board having an aperture for receiving an electrical component therethrough, an electrical component assembling device, comprising:

a body member configured to receive said electrical component and at least partially extend through said aperture, said body member having a base and a side wall extending from said base;

a first clip coupled to said body member and extending from said side wall, said first clip including a first pressure bearing member configured to exert a force against said circuit board to thereby secure said body member to said circuit board; and a second clip coupled to said body member and extending from said side wall, said second clip including a second pressure bearing member configured to exert a force in a direction of said base against said electrical component to thereby secure said electrical component to said body member.

2. The electrical component assembling device of claim 1 wherein said first pressure bearing member of said first clip includes a flexible securing member extending outwardly from said body member and configured to be partially received through said aperture, said flexible securing member having a first engaging portion and a second engaging portion to engage opposite sides of said circuit board, to thereby secure said body member to said circuit board.

3. The electrical component assembling device of claim 1 wherein said first pressure bearing member includes a flexible first securing member extending outwardly from said body member and an opposing second securing member extending outwardly from said body member, said first securing member configured to be resiliently received through said aperture, said first and second securing members configured to engage opposite sides of said circuit board, to thereby secure said body member to said circuit board.

4. The electrical component assembling device of claim 1 wherein said second pressure bearing member is a flexible elongated member having an inwardly projecting engaging end extending toward said body member to engage an outer surface of said electrical component, to thereby exert said force between said outer surface and said body member.

5. The electrical component assembling device of claim 4 wherein said second bearing member comprises at least two of said flexible elongated members, said at least two of said flexible elongated members positioned on opposite sides of said body member in an opposing relationship.

6. The electrical component assembling device of claim 1 wherein said first and second clips are integrally formed with said body member.

7. The electrical component assembling device of claim 6 wherein said body member and said first and second clips are comprised of a flexible material selected from the group consisting of metal and plastic.

8. The electrical component assembling device of claim 1 wherein said body member further comprises retaining tabs positioned on opposite side edges of said body member, said retaining tabs configured to engage a side surface of said electrical component, to thereby prevent lateral movement of said electrical component with respect to said body member.

9. An electrical component assembly, comprising:
   a circuit board having an aperture for receiving an electrical component therethrough; and
   an electrical component assembling device, including:
   a body member configured to receive said electrical component and at least partially extend through said aperture, said body member having a base and a side wall extending from said base;
   a first clip coupled to said body member and extending from said side wall, said first clip including a first pressure bearing member configured to exert a force against said circuit board to thereby secure said body member to said circuit board; and
   a second clip coupled to said body member and extending from said side wall, said second clip including a second pressure bearing member configured to exert a force in a direction of said base against said electrical component to thereby secure said electrical component to said body member.

10. The electrical component assembly of claim 9 wherein said first pressure bearing member includes a flexible securing member extending outwardly from said body member and configured to be partially received through said aperture, said flexible securing member having a first engaging portion and a second engaging portion to engage opposite sides of said circuit board, to thereby secure said body member to said circuit board.

11. The electrical component assembly of claim 9 wherein said first pressure bearing member includes a flexible first securing member extending outwardly from said body member and an opposing second securing member extending outwardly from said body member, said first securing member configured to be resiliently received through said aperture, said first and second securing members configured to engage opposite sides of said circuit board, to thereby secure said body member to said circuit board.

12. The electrical component assembly of claim 9 wherein said second pressure bearing member is a flexible elongated member having an inwardly projecting engaging end extending toward said body member to engage an outer surface of said electrical component, to thereby exert said force between said outer surface and said body member.

13. The electrical component assembly of claim 12 wherein said second pressure bearing member comprises at least two of said flexible elongated members, said at least two of said flexible elongated members positioned on opposite sides of said body member in an opposing relationship.

14. The electrical component assembly of claim 9 wherein said first and second clips are integrally formed with said body member.

15. The electrical component assembly of claim 14 further comprising a magnetic core having first and second core members.

16. The electrical component assembly of claim 9 wherein said body member further comprises retaining tabs positioned on opposite side edges of said body member, said retaining tabs configured to engage a side surface of said electrical component, to thereby prevent lateral movement of said electrical component with respect to said body member.

17. A method for fabricating an electrical component assembly comprising the steps of:
   inserting at least a portion of a body member through an aperture in a circuit board, said body member configured to receive said electrical component and at least partially extend through said aperture, said body member having a base and a side wall extending from said base;
   engaging a first pressure bearing member of a first clip coupled to said body member and extending from said side wall against said circuit board, to thereby secure said body member to said circuit board;
   inserting an electrical component having an outer surface into said body member; and
   engaging a second pressure bearing member of a second clip coupled to said body member and extending from said side wall against said outer surface of said electrical component, to thereby secure said electrical component in said body member, said second bearing member exerting a force in a direction of said base.

18. The method of claim 17 wherein step of engaging said second pressure bearing member of said second clip includes the step of engaging a flexible elongated member against said outer surface of said electrical component, to thereby exert said force between said outer surface and said body member.

19. The method of claim 17 wherein said step of engaging said first pressure bearing member of said first clip includes the steps of:
   receiving a resilient first securing member through said aperture;
   engaging said first securing member against a first side of said circuit board; and
   engaging an opposing second securing member against a second side of said circuit board, to thereby secure said body member to said circuit board.

20. The method of claim 17 further comprising the step of inserting a first magnetic core member in said body member prior to inserting said body member through said aperture and wherein the step of inserting an electrical component includes the step of inserting a second magnetic core member in said body member.

* * * * *